United States Patent [19]
Chan et al.

[11] Patent Number: 6,153,933
[45] Date of Patent: Nov. 28, 2000

[54] ELIMINATION OF RESIDUAL MATERIALS IN A MULTIPLE-LAYER INTERCONNECT STRUCTURE

[75] Inventors: Darin A. Chan, Campbell; Steven C. Avanzino, Cupertino; Subramanian Venkatkrishnan, Sunnyvale; Minh Van Ngo, Union City; Christy Mei-Chu Woo de la Girond'arc, Cupertino; Diana M. Schonauer, San Jose, all of Calif.

[73] Assignee: Advanced Micro Devices, Inc., Sunnyvale, Calif.

[21] Appl. No.: 08/925,821

[22] Filed: Sep. 5, 1997

[51] Int. Cl.[7] .................................................. H01L 23/48
[52] U.S. Cl. .......................... 257/752; 257/758; 438/622; 438/631
[58] Field of Search .................................... 257/752, 758, 257/777; 438/626, 631, 645, 118, 622

[56] References Cited

U.S. PATENT DOCUMENTS

| | | | |
|---|---|---|---|
| 5,387,535 | 2/1995 | Wilmsmeyer | 427/57 |
| 5,391,520 | 2/1995 | Chen et al. | 437/200 |
| 5,453,400 | 9/1995 | Abernathey et al. | 437/192 |
| 5,489,797 | 2/1996 | Chan et al. | 257/382 |
| 5,496,774 | 3/1996 | Pramanik et al. | 437/195 |
| 5,497,025 | 3/1996 | Wong | 257/435 |
| 5,510,652 | 4/1996 | Burke et al. | 257/752 |
| 5,516,726 | 5/1996 | Kim et al. | 437/189 |
| 5,521,106 | 5/1996 | Okabe | 432/41 |
| 5,563,096 | 10/1996 | Nasr | 437/186 |
| 5,589,415 | 12/1996 | Blanchard | 437/57 |
| 5,599,740 | 2/1997 | Jang et al. | 437/190 |
| 5,602,423 | 2/1997 | Jain | 257/752 |
| 5,621,232 | 4/1997 | Ohno | 257/288 |
| 5,621,235 | 4/1997 | Jeng | 257/384 |

*Primary Examiner*—Roy Potter

[57] ABSTRACT

A multiple-layer interconnect structure in an integrated circuit, is formed using damascene techniques. A first layer interconnect has a first dielectric layer through which at least one first layer conductor extends. A second layer interconnect is then formed on the first layer interconnect. The second layer interconnect also includes a second layer dielectric through which at least one second layer conductor extends. However, the second layer interconnect is created by first forming a thick second later dielectric layer and then reducing the thickness of the second layer dielectric prior to a patterning step. As a result topographical irregularities that may have carried over to the second layer interconnect from the first layer interconnect are removed by providing a substantially planar surface on the second layer dielectric.

12 Claims, 4 Drawing Sheets

6,153,933

ELIMINATION OF RESIDUAL MATERIALS IN A MULTIPLE-LAYER INTERCONNECT STRUCTURE

TECHNICAL FIELD

The present invention relates to semiconductor devices and manufacturing processes, and more particularly to improved methods and arrangements for fabricating integrated circuits having multiple-layered interconnects.

BACKGROUND ART

A continuing trend in semiconductor technology is to build integrated circuits with more and/or faster semiconductor devices. The drive toward this ultra large scale integration has resulted in continued down-scaling or shrinking of device and circuit dimensions and features. One potential limiting factor associated with the down-scaling is the use of multiple-layers of interconnect required to complete the integrated circuit by connecting the various semiconductor devices together.

As is known in the art, if the average interconnect length can be reduced along with the dimensions of the devices then performance is typically enhanced. This has resulted in the use of multiple-layers of interconnects. These multiple-layers of interconnects can be very complex for certain types of integrated circuits. Moreover, as the device dimensions are scaled down, the structure of the interconnects becomes more complicated. By way of example, the dimensions of the interconnects needs to match the reduced dimensions of the devices. Additionally, as the number of devices to be connected is increased, so too is the number of interconnects increased. Since the typical circuit die size is not proportionally increased as the number of devices are increased, the current trend is to increase the number of interconnecting layers so as to provide the additional interconnects required. Thus, there is a need for improved methods and arrangements for fabricating multiple-levels of interconnects so as to further scale-down the integrated circuit size and increase performance, without compromising the yield of the manufacturing process and the reliability of integrated circuits.

SUMMARY OF THE INVENTION

In accordance with the present invention, a potential failure mechanism has been discovered in the conventional integrated circuits. This failure mechanism results from irregularities in a lower interconnect layer being carried over to a higher interconnect layer within the multiple-layered interconnect structure. In accordance with the present invention there are provided improved methods and arrangements for forming multiple-layers of interconnects using damascene techniques that avoid this potential failure mechanism.

Thus, in one embodiment of the present invention, a method is provided for forming a multiple-layer interconnect structure in an integrated circuit using damascene techniques. The method includes forming a first layer interconnect having a first dielectric layer through which at least one first layer conductor extends, and forming a second layer interconnect on the first layer interconnect. The second layer interconnect includes a second layer dielectric through which at least one second layer conductor extends. The second layer interconnect is created by forming a thicker second layer dielectric and then reducing the thickness of the second layer dielectric prior to a patterning step. Thus, the result is that topographical irregularities carried over to the second layer interconnect from the first layer interconnect, such as, for example, a depression caused by a scratch, dent, chip, or a previous process step, is essentially removed by providing a thicker second layer dielectric and reducing the thickness to provide a substantially planar surface prior to patterning the second layer dielectric. For example, in certain embodiments, the method includes patterning the second layer dielectric to form an etched opening, and filling the etched opening with a conductive material to form the second layer conductor.

The above stated needs are further met by an arrangement that, in accordance with one embodiment of the present invention, includes a wafer stack, a first interconnect layer formed on the wafer stack, and a second interconnect layer formed on the first interconnect layer. The first interconnect layer includes at least one depression. The second interconnect layer includes a substantially planarized top surface located above the first interconnect layer and the depression in the first dielectric layer.

The foregoing and other features, aspects and advantages of the present invention will become more apparent from the following detailed description of the present invention when taken in conjunction with the accompanying drawings.

BRIEF DESCRIPTION OF THE DRAWINGS

The present invention is illustrated by way of example, and not by way of limitation, in the figures of the accompanying drawings and in which like reference numerals refer to similar elements in which.

DETAILED DESCRIPTION OF THE EXEMPLARY EMBODIMENTS

The process steps and structures described below do not form a complete process flow for manufacturing integrated circuits. The present invention can be practiced in conjunction with integrated circuit fabrication techniques currently used in the art, and only so much of the commonly practiced process steps are included as are necessary for an understanding of the present invention. The figures representing cross-sections of portions of an integrated circuit device during fabrication are not drawn to scale, but instead are drawn so as to illustrate the important features of the present invention.

In accordance with the present invention, a potential failure mechanism has been discovered in the conventional integrated circuits. This failure mechanism results from irregularities in a lower layer being carried over to a higher layer in the multiple-layered interconnect structure. In accordance with the present invention there are provided improved methods and arrangements for forming multiple-layers of interconnects using damascene techniques that avoid this failure mechanism.

Figure 1A:
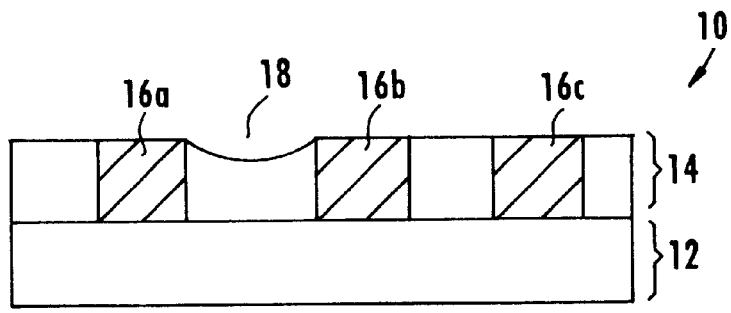
FIG. 1a depicts a cross-section of a portion of a conventional semiconductor wafer that has been fabricated with a first interconnect layer.

The failure mechanism recognized in the present invention will first be described, followed by the methods and arrangements that essentially eliminate the failure mechanism. FIG. 1a depicts a cross-section of a portion 10 of a conventional semiconductor wafer that has been fabricated with a first interconnect layer. Portion 10 includes a wafer stack 12, a first dielectric layer 14, and first conductor plugs 16a, 16b and 16c. Wafer stack 12 includes at least one semiconductor layer in which at least one device has been fabricated during previous process steps. For example, as is well known in the art, a field effect transistor can be formed by defining gate, source and drain regions in one or more layers of wafer stack 12. For the purposes of this invention, the devices formed in wafer stack 12 can include any type of active or passive device and/or component. As depicted, first dielectric layer 14 has been formed over wafer stack 12 and patterned, using conventional damascene techniques, to include first layer conductive plugs 16a–c. Each of the first layer plugs 16a–c extend through first dielectric layer 14 to wafer stack 12 so as to provide electrical connectivity to particular devices within wafer stack 12. For example, assuming that the device is a transistor, plug 16a is coupled to the source region, plug 16b is coupled to the gate, and plug 16c is coupled to the drain region.

In forming first conductive layer plugs 16a–c, in accordance with conventional damascene techniques, portion 10 has been planarized, for example, using etching or chemical-mechanical polishing (CMP) processes, so that the tops of plugs 16a–c are significantly level with the top of first dielectric layer 14. For example, first dielectric layer, which can be any suitable dielectric material, such as, for example, a TEOS oxide, is deposited on wafer stack 12 using a CVD or like deposition process. Next, the TEOS oxide is patterned using conventional lithographic techniques and an etching process is used to provide openings through the TEOS oxide to wafer stack 12. The openings are then filled with a conductive material, such as, for example, tungsten or like metal. The excess tungsten (W) and any excess adhesion materials, such as TiN or the like, are then removed to leave a substantially planar surface, as shown in FIG. 1a.

However, as depicted in FIG. 1a, the planarization process is not always consistent and often results in a non-planar surface, such as, for example, first layer depression 18, wherein first dielectric layer 14 is dished out or otherwise made non-planar. Returning to the example above, depression 18 can result from marring that occurs during a CMP process that effectively polishes the excess tungsten deposited for plugs 16a–c, but also undesirably removes a portion of the TEOS oxide between plugs 16a and 16b.

Figure 1B:
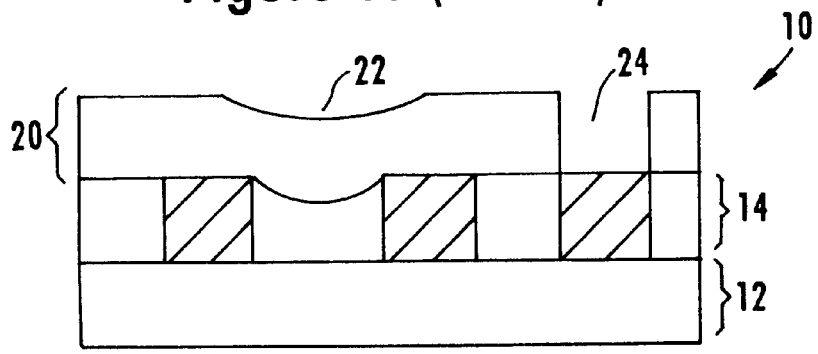
FIG. 1b depicts a cross-section of the portion of FIG. 1a after having a patterned second layer dielectric formed on top of the first layer interconnect.
Figure 1C:
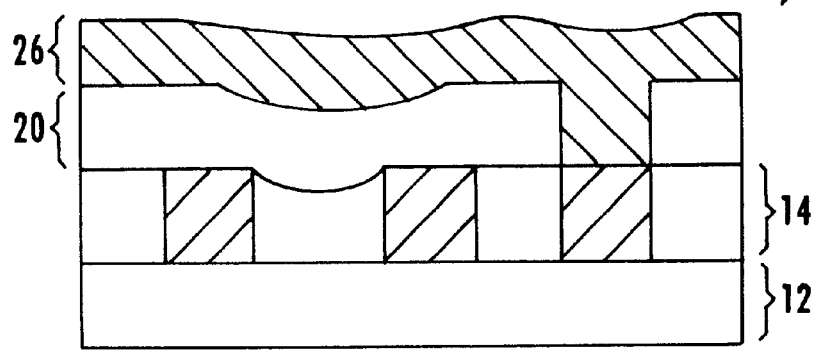
FIG. 1c depicts a cross-section of the portion of FIG. 1b after having a second layer conductor deposited on top of the patterned second layer dielectric.

FIG. 1b depicts a cross-section of the portion of FIG. 1a after having a patterned second layer dielectric 20 formed on top of the planarized first layer interconnects (i.e., dielectric 14 and plugs 16a–c) of FIG. 1a. As depicted, a second layer depression 22 has formed in second layer dielectric 20 which has been conformably deposited over first layer depression 18. Second layer dielectric 20 has been patterned, as part of a damascene process, to include an etched opening 24 that extends through second layer dielectric 20 to an exposed surface of first layer conductor plug 16c. Next, in FIG. 1c, second layer dielectric 20 has been covered, partially or completely, with a second layer conductor 26 that fills etched opening 24.

Figure 1D:
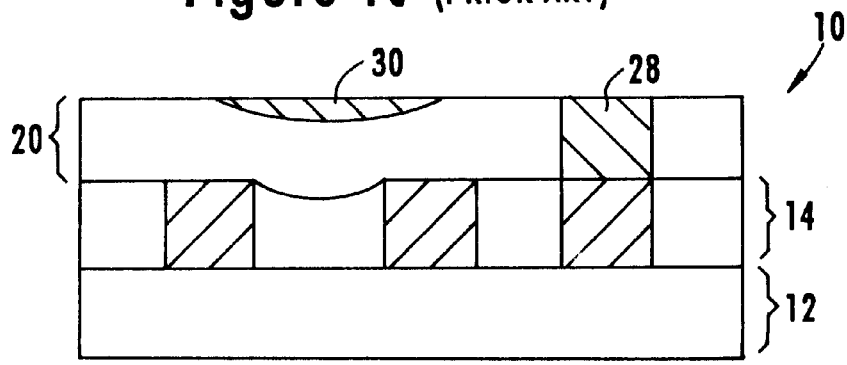
FIG. 1d depicts a cross-section of the portion of FIG. 1c after having the second layer conductor planarized down to the patterned second layer dielectric, leaving a second layer conductive plug and a second layer residual material as part of the second layer interconnect.

In FIG. 1d second layer dielectric 20 has been planarized down to the patterned second layer dielectric thereby leaving a second layer conductor plug 28 in etched opening 24, and a second layer residual material 30 in second layer depression 22.

Alternatively, a second layer residual material 30' can form due to the nature of CMP processing wherein localized depressions, such as defect 18', are formed as a result of the local interconnect pattern. This alternative defect 18', and residual material 30' are depicted in FIGS. 1f through 1i.

Figure 1E:
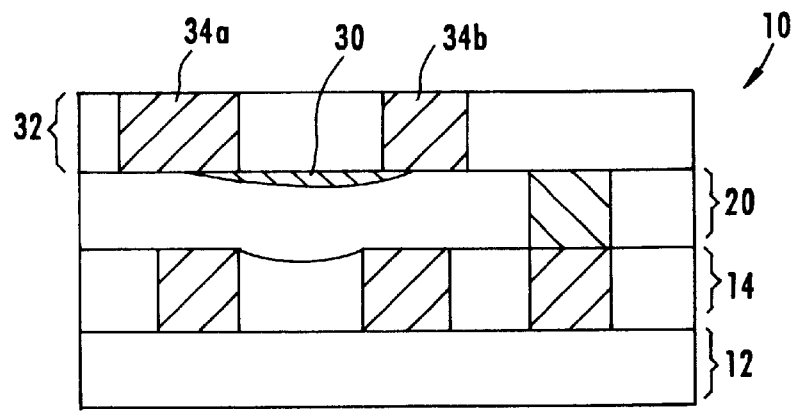
FIG. 1e depicts a cross-section of the portion of FIG. 1d after having a third layer interconnect deposited on top of the second layer interconnect, wherein two third layer conductors plugs have been electrically shorted by the second layer residual material.

As depicted in FIG. 1e, second layer residual material 30 (or 30') can detrimentally affect the structure and resulting electrical properties of subsequently formed interconnect layers, such as a third layer interconnect that includes third layer dielectric 32 and third layer conductive plugs 34a and 34b. As shown, second later residual material 30 (or 30') contacts plugs 34a and 34b and as such electrically short circuits these interconnecting lines. Since plugs 34a and 34b are intended to be electrically isolated in this example, the integrated circuit being formed will most likely not operate as expected.

The present invention having identified the source of this failure mechanism that is the effect of residual materials in subsequent interconnect layers, provides a solution that significantly eliminates the residual materials.

Figure 2A:
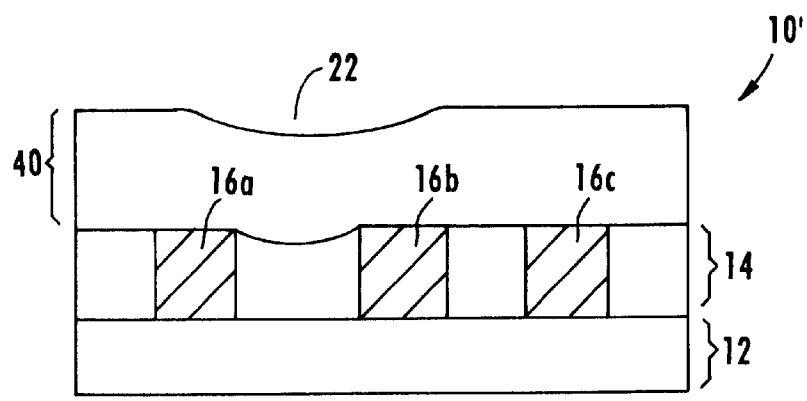
FIG. 2a depicts a cross-section of a portion of a semiconductor wafer, in accordance with one embodiment of the present invention, that has been fabricated with a first interconnect layer and covered with an increased second layer dielectric.

FIG. 2a depicts a cross-section of a portion 10' of a semiconductor wafer, in accordance with certain embodiments of the present invention, that has been fabricated with a first interconnect layer, as in FIG. 1a, having a first layer depression 18 between plugs 16a and 16b, and covered with a second layer dielectric 40 that is thicker than the conventional second layer dielectric 20, as in FIG. 1b. As shown, the increased second dielectric 40 also exhibits a second layer depression 22 that is caused by first layer depression 18. By way of example, in one embodiment of the present invention, first dielectric layer 14 has a thickness of approximately 10,000 to 15,000 Å, conventional second layer dielectric 20 has a thickness of approximately 5,000 Å, and increased second layer dielectric 40 has a thickness of at least 10,000 Å. It is recognized, however, that the thickness of the dielectric can be adjusted either up or down, and that these values above are intended as just one example.

Figure 2B:
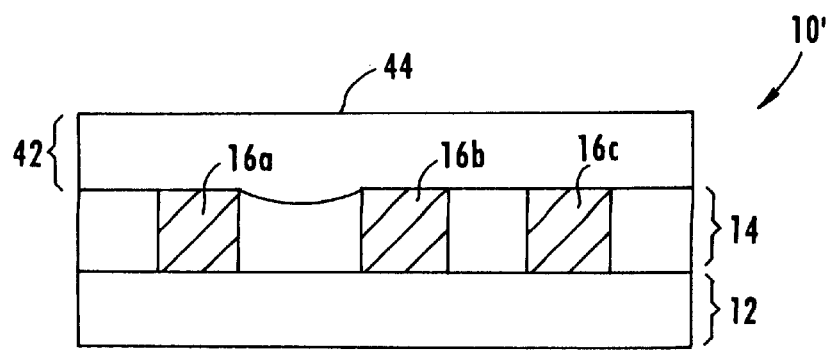
FIG. 2b depicts a cross-section of the portion of FIG. 2a after having the increased second layer dielectric reduced in thickness to a planarized second layer dielectric, in accordance with one embodiment of the present invention.
Figure 1F:
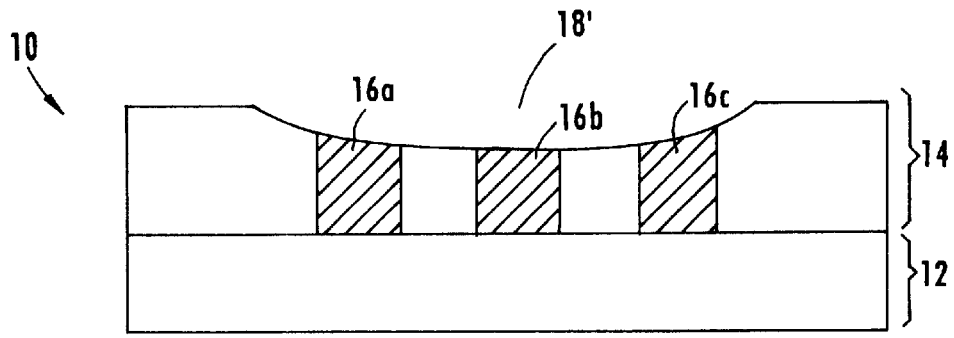
FIGS. 1f–1i sequentially depict a cross-section of a portion of a conventional semiconductor wafer having a localized depression caused by a pattern density and chemical-mechanical interaction that lead to a second layer residual material being formed.
Figure 1G:
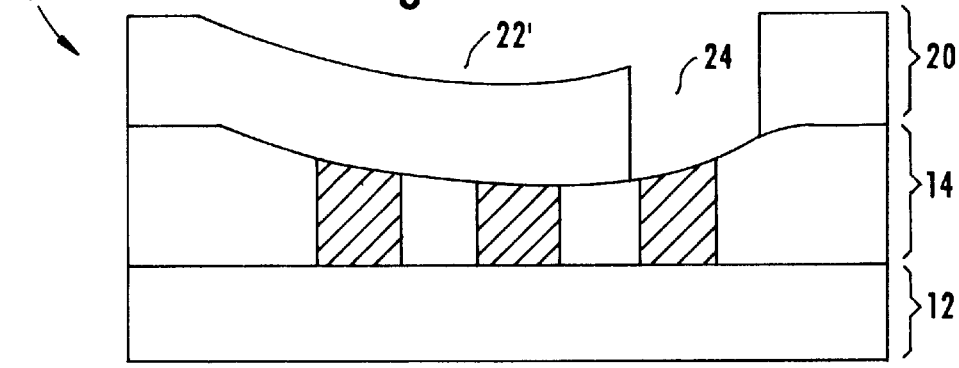
Figure 1H:
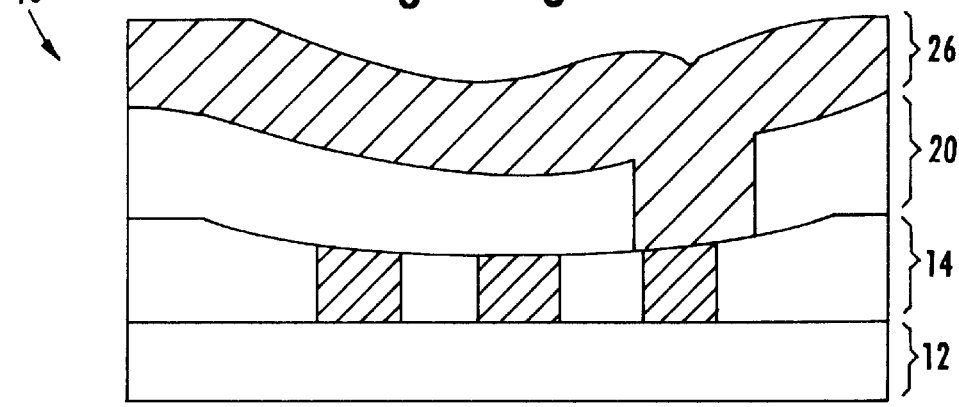
Figure 1I:
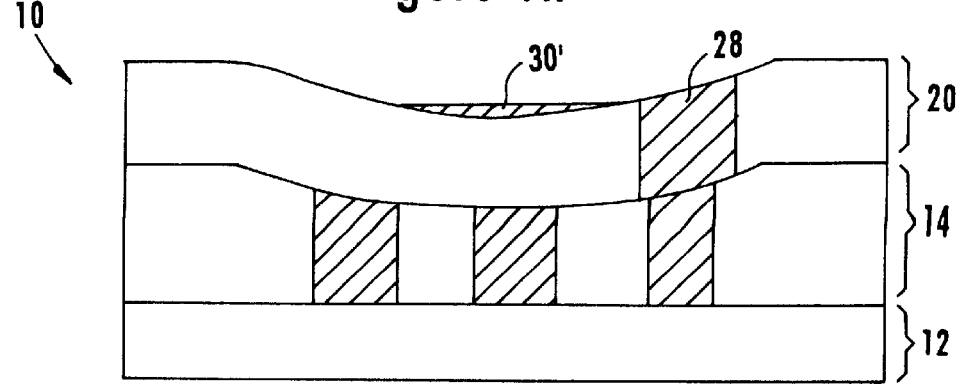

Next, in accordance with the present invention, as depicted by portion 10' in FIG. 2b the increased second layer dielectric is reduced in thickness, for example from 10,000 Å down to 5,000 Å using CMP planarization techniques, to form a planarized second layer dielectric 42 that has a substantially planar top surface 44. Thus, in accordance with the present invention, second layer depression 22 has been eliminated.

Figure 2C:
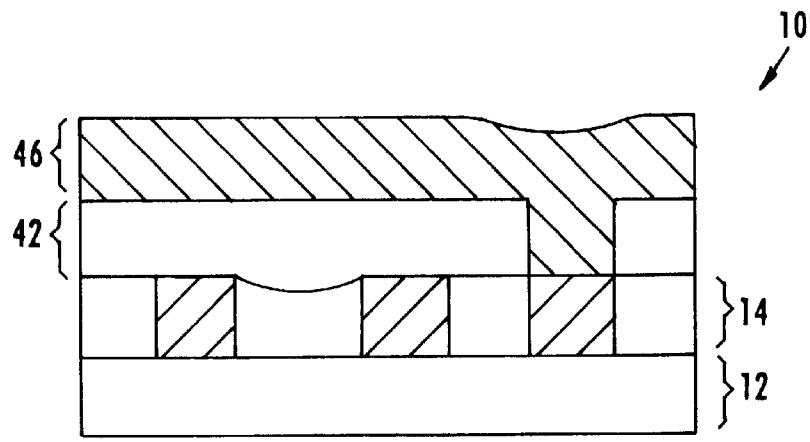
FIG. 2c depicts a cross-section of the portion of FIG. 2b after having a second layer conductor deposited on top of the planarized second layer dielectric that has also been patterned, in accordance with one embodiment of the present invention.
Figure 2D:
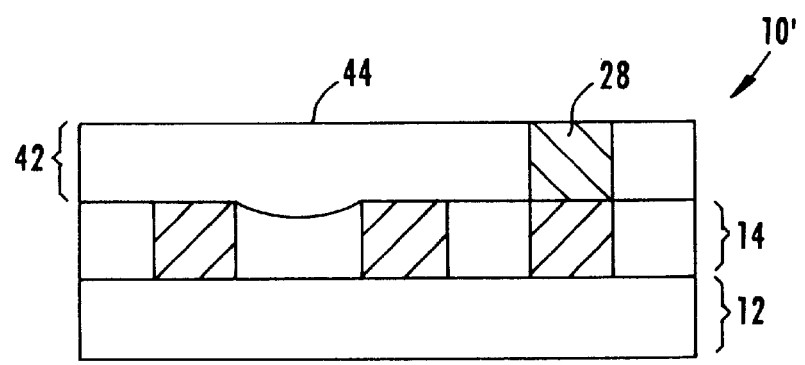
FIG. 2d depicts a cross-section of the portion of FIG. 2c after the second layer conductor has been planarized down to the planarized second layer dielectric, leaving a second layer conductive plug, in accordance with one embodiment of the present invention.

In FIG. 2c a second layer conductor 46 is deposited on top of planarized second layer dielectric 42 which has also been patterned to reveal an etched opening 24, as in FIG. 1b. As shown, second layer conductor 46 fills etched opening 24. In FIG. 2d second layer conductor 46 has been planarized down to the planarized second layer dielectric, for example, using a CMP, to form a second layer conductive plug 28. Thus, unlike portion 10 in FIG. 1d, the substantially flat top surface 44 of planarized second layer dielectric 42 impedes the build-up or formation of any second layer residual materials.

Figure 2E:
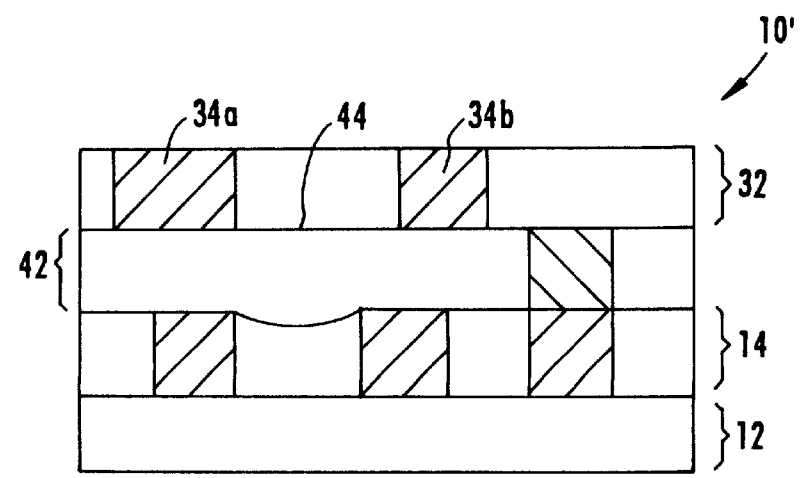
FIG. 2e depicts a cross-section of the portion of FIG. 2d after a third layer interconnect is deposited on top of the second layer interconnect, wherein two third layer conductors plugs are electrically isolated from one another, in accordance with one embodiment of the present invention.

Thus, as depicted FIG. 2e, in a subsequently formed third layer interconnect that includes a third layer dielectric 32 electrically separating two third layer conductive plugs 34a and 34b, the electrical isolation of plugs 34a and 34b is not compromised by any second layer residual materials.

The methods and arrangements of the present invention are contrary to the typical processes used in fabricating multiple-layered interconnects using damascene techniques because the formation of the residual material has heretofore been unknown. Thus, in the past once the first interconnect layer has been planarized there has never been a recognized need to form a thicker second layer dielectric and to planarize the dielectric prior to patterning and/or depositing the second layer conductive material. These added steps increase the complexity and costs associated with the fabrication process, and tend to reduce process throughput. Thus, heretofore these added steps would not have been included in the fabrication process, but the benefits obtained in improving the yield outweighs the increased complexity and costs.

Although the present invention has been described and illustrated in detail, it is to be clearly understood that the same is by way of illustration and example only and is not to be taken by way of limitation, the spirit and scope of the present invention being limited only by the terms of the appended claims.

What is claimed is:

1. An arrangement comprising:

a wafer stack;

a first interconnect layer formed on the wafter stack, wherein the first interconnect layer includes at least one depression formed in a first dielectric layer; and a second interconnect layer formed on the first interconnect layer, wherein the second interconnect layer includes a substantially planarized top surface located above the first interconnect layer and the depression in the first dielectric layer, the second interconnect layer being substantially free of residual conductive material, wherein the second interconnect layer includes a second dielectric layer and at least one second layer conductor that extends downwardly from the top surface through the second layer dielectric to the first layer interconnect.

2. The arrangement as recited in claim 1, wherein the second layer dielectric includes TEOS oxide.

3. The arrangement as recited in claim 2, wherein the second layer conductor includes a metal.

4. The arrangement as recited in claim 3, wherein the metal includes tungsten (W).

5. A method for forming a multiple-layer interconnect structure in an integrated circuit using damascene techniques, the method comprising:

forming a first layer interconnect having a first dielectric layer through which at least one first layer conductor extends;

forming a second layer interconnect on the first layer interconnect, the second layer interconnect having a second layer dielectric through which at least one second layer conductor extends, by forming the second layer dielectric to a first thickness and substantially planarizing the second layer dielectric to reduce the first thickness to a second thickness prior to patterning the second layer dielectric;

patterning the second layer dielectric to form an etched opening; and filling the etched opening with a conductive material to form the second layer conductor.

6. The method as recited in claim 1, wherein forming the second layer interconnect further includes planarizing the conductive material to be substantially level with the top surface of the second layer dielectric.

7. The method as recited in claim 1, wherein the second layer dielectric includes TEOS oxide.

8. The method as recited in claim 7, wherein the first thickness is greater than approximately 10,000 Å.

9. The method as recited in claim 7, wherein the second thickness is less than or equal to approximately 5,000 Å.

10. The method as recited in claim 1, wherein the conductive material is a metal.

11. The method as recited in claim 10, wherein the metal includes tungsten.

12. The method as recited in claim 6, wherein the planarizing of the conductive material includes the step of chemical-mechanical polishing (CMP).

* * * * *